(12) United States Patent
Otsuki et al.

(10) Patent No.: US 6,924,983 B2
(45) Date of Patent: Aug. 2, 2005

(54) HEAT SINK FAN

(75) Inventors: Takaya Otsuki, Yonago (JP);
Hidenobu Takeshita, Oita (JP);
Hirokazu Kimura, Yonago (JP)

(73) Assignee: Nidec Corporation, Kyoto (JP)

( * ) Notice: Subject to any disclaimer, the term of this patent is extended or adjusted under 35 U.S.C. 154(b) by 187 days.

(21) Appl. No.: 10/604,473

(22) Filed: Jul. 24, 2003

(65) Prior Publication Data

US 2004/0108102 A1 Jun. 10, 2004

(30) Foreign Application Priority Data

Aug. 5, 2002 (JP) .......................................... 2002-227308

(51) Int. Cl.⁷ ................................................. H05K 7/20
(52) U.S. Cl. ...................... 361/704; 361/695; 361/710; 361/712; 165/80.2; 165/104.33; 165/165; 257/719
(58) Field of Search ............................... 361/702–707, 361/710–717, 720, 726–727, 719, 686, 687, 692, 699; 165/80.2, 80.3, 165, 185, 104.32–104.34; 174/16.1, 16.3, 52.4; 257/706–727, 730, 796; 24/457, 458

(56) References Cited

U.S. PATENT DOCUMENTS 6,118,656 A    9/2000  Wang
6,341,644 B1 *  1/2002  Lo et al. ..................... 165/80.3
6,343,013 B1 *  1/2002  Chen ........................... 361/695
6,480,383 B2 * 11/2002  Kodaira et al. .............. 361/697
6,515,862 B1 *  2/2003  Wong et al. ................. 361/710
6,621,699 B2 *  9/2003  Watanabe et al. ........... 361/697
2002/0070005 A1  6/2002  Kawabata et al.

FOREIGN PATENT DOCUMENTS

| JP | H9-321186 A | 12/1997 | |
|---|---|---|---|
| JP | 2959506 B2 | 10/1999 | |
| JP | 3030526 B2 | 4/2000 | |
| JP | 2000-151163 A | 5/2000 | |
| JP | 2002-26550 A | 1/2002 | |
| JP | 02002134972 A1 * | 5/2002 | ............ H05K/7/20 |

* cited by examiner

Primary Examiner—Michael Datskovskiy
(74) Attorney, Agent, or Firm—Shinjyu Global IP

(57) ABSTRACT

A heat sink fan comprises a heat sink (2) including a base member (21) and a plurality of thin heat radiating fins (22) fixed thereto, and a fan case (1) for supporting an axial flow fan (18) that induces air flow for cooling the heat sink (2). The fan case (1) includes an upper wall portion (11), at least one pair of engaging portions (12) depending from side edges of the upper wall portion (11), and a protruding portion (13) formed at the substantial middle portion of both end portions in the longitudinal direction of the upper wall portion (11). A thickness of one or more heat radiating fins (2) facing to the protruding portion (13) is larger than a thickness of other heat radiating fins.

6 Claims, 5 Drawing Sheets

HEAT SINK FAN

BACKGROUND OF INVENTION

1. Field of the Invention

The present invention relates to a heat sink fan for cooling electronic components such as a micro processing unit.

2. Description of the Related Art

A heat sink fan that is attached to a heat-generating electronic component such as micro processing unit (MPU), usually includes a heat sink that is placed on the MPU and a fan case that is attached to the heat sink and houses a fan for forcedly cooling the heat sink by blowing air thereto. The heat sink that is used for such heat sink fans, which is conventionally made of high heat conductive material such as an aluminum or the like, is made by a die-cast molding. However, a heat radiating fin, which is integrally formed with the heat sink for dissipating heat generated by the electronic component, is restricted on thickness and shape, if the heat sink and the heat radiating fin are made by die-cast molding. Consequently, the heat sink fan using the heat sink made by the die-cast molding cannot sufficiently cool the MPU generating large amount of heat. Therefore, an improved heat sink is proposed, in which thin heat radiating fins formed by press working are fixed to a base member made of a copper, a cooper alloy or the like by crimping the fins fitted in grooves formed on the base member. Such heat sink has some advantages. First, because thickness of each heat radiating fin can be small, the number of heat radiating fins arranged per unit area of the base member can be increased. Secondary, the heat radiating fins can be made of a material different from the base member. Accordingly, such a heat sink can increase the heat radiating surface and/or dimension compared with the conventional heat sink made by the die-cast molding and large amount of heat can be radiated, therefore, the cooling efficiency of the entire heat sink can be improved dramatically.

However, such a thin heat radiating fin is easily deformed by an external force, because the thickness of each heat radiating fin is small. Particularly, if a heat sink fan is attached to an MPU by using an attachment member such as a clip or fastener that utilizes elasticity, the fan case, which is generally made of a resin material, is deformed by stress of the clamping force of the attachment member. The deformed fan case presses the heat radiating fin and the heat radiating fin is deformed. The deformation of the thin heat radiating fin may change an air flow induced by the fan or may cause interception of the air flow so that cooling performance or effect of the heat sink fan is deteriorated.

SUMMARY OF INVENTION

An object of the present invention is provide a heat sink fan that can prevent heat radiating fins from being deformed even if a fan case is deformed by stress of a clamping force of an attachment member and presses the thin heat radiating fin.

Another object of the present invention is provide a heat sink fan that can prevent heat radiating fins from being deformed and can be stably fixed the heat radiating fins to a base member.

Still another object of the present invention is to provide a heat sink fan that can be handled easily in manufacturing process so that productivity can be improved.

A heat sink fan according to one aspect of the present invention comprises a heat sink including a base member having a planar shape and a plurality of thin heat radiating fins being fixed to the base member so as to be parallel with each other, and a fan case that is attached to the heat sink to cover the upper portion of the heat radiating fins and supports a fan for inducing air flow for cooling the heat sink. The fan case includes an upper wall portion, which is provided with a protruding portion at a position facing to the heat sink. The heat radiating fin fixed to the position facing to the protruding portion of the base member has a thickness larger than a thickness of other heat radiating fins fixed to other positions of the base member.

Because the protruding portion is formed on the upper wall portion of the fan case at the portion where an external force is concentrated for reinforcing the fan case, a distortion or a deformation of the fan case due to an external force can be relieved. In addition, because the thickness of the heat radiating fin facing to the protruding portion is larger than the thickness of other heat radiating fins, a deformation of the heat radiating fin can be prevented even if the fan case is deformed and presses the heat radiating fin.

Furthermore, a heat sink fan according to another aspect of the present invention comprises a heat sink including a base member having a planer shape and thin heat radiating fins being fixed to the base member so as to be parallel with each other, and a fan case that is attached to the heat sink to cover the upper portion of the heat radiating fins and supports a fan for inducing air flow for cooling the heat sink. The fan case includes an upper wall portion, which is provided with a protruding portion at a position facing to the heat sink. The heat radiating fin fixed to the position facing to the protruding portion of the base member has a thickness larger than a thickness of other heat radiating fins fixed to other positions of the base member. In addition, a the heat radiating fin facing to the protruding portion is more deeply engaged with the base member other heat radiating fins when the heat radiating fins engage and are fixed to the base member.

In this way, because the protruding portion is formed on the upper wall portion of the fan case at the portion where an external force can be applied, a distortion or a deformation of the fan case due to an external force can be relieved. In addition, because the thickness of the heat radiating fin facing to the protruding portion is larger than the thickness of other heat radiating fins, a deformation of the heat radiating fin can be prevented even if the fan case is deformed and abuts the heat radiating fin. Furthermore, the heat radiating fin having larger thickness than other heat radiating fins are more deeply engaged with the base member than other heat radiating fins, the heat radiating fin having larger thickness can be fixed to the base member more securely.

DETAILED DESCRIPTION

Hereinafter, heat sink fans of embodiments of the present invention will be explained with reference to FIGS. 1–5.

Figure 1:
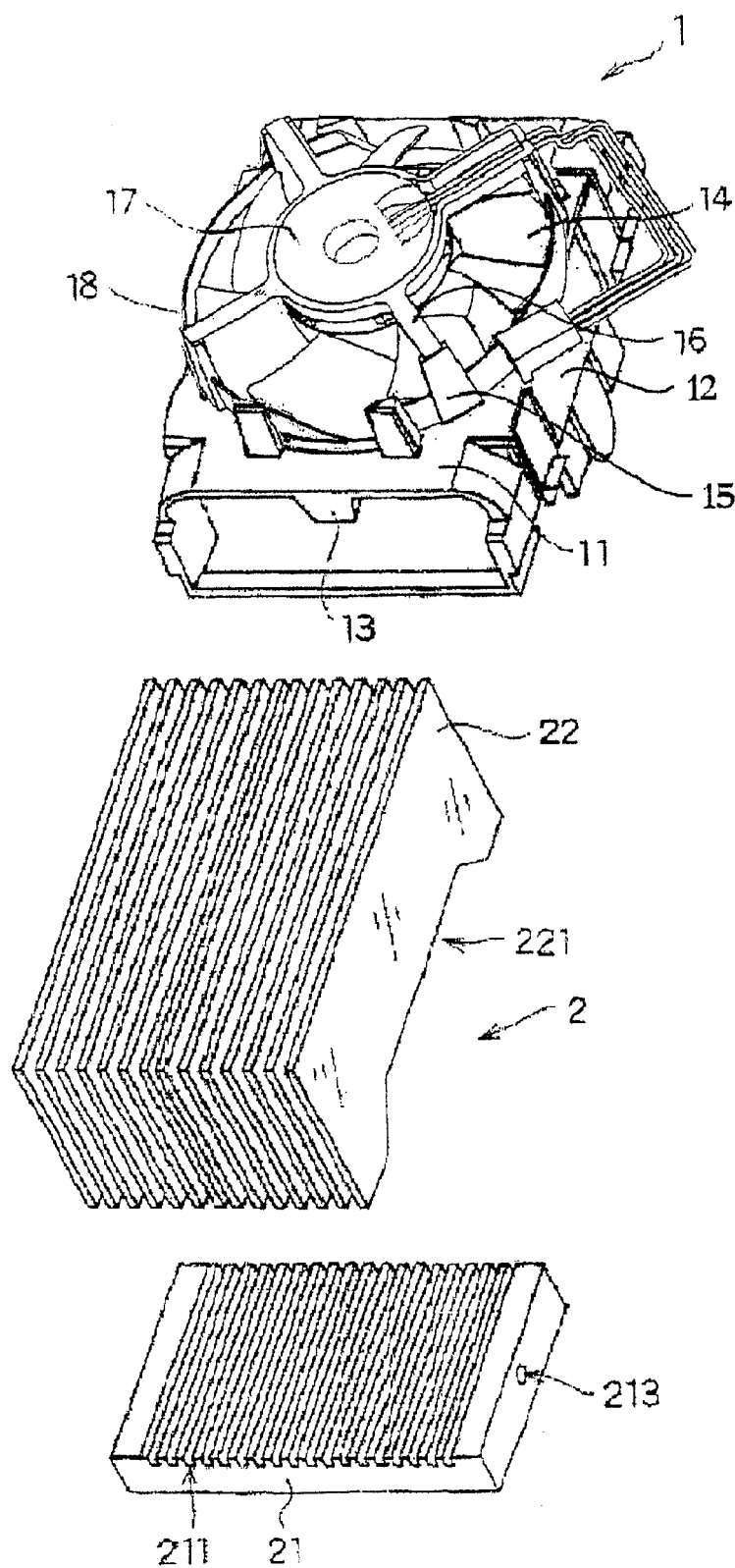
FIG. 1 is an exploded perspective view of a heat sink fan according to a first embodiment of the present invention.

The heat sink fan shown in FIG. 1 includes a heat sink 2 and a fan case 1 as main elements, and the fan case 1 is detachably attached to the heat sink 2. The fan case 1, which is made of a resin material(as described details in below), includes an upper wall portion 11 having a substantially rectangular shape and a pair of side walls 12 integrally formed with the upper wall portion 11 and depending from both outer sides in the longitudinal direction of the upper wall portion 11. Engaging portions 12a are formed on the side walls 12 and protrusions 12b (see FIG. 5) are formed at each end portion of the engaging portions 12a, and the protrusions 12a protrude in the inward direction. The protrusions 12b are engaged with an engaging hole 213 that is formed on the heat sink 2 as being explained later, so that the fan case 1 can be detachably attached to the heat sink 2 by elastic deformation of the protrusions 12a. In addition, as being explained later, a pair of protruding portions 13 are formed integrally to the upper wall portion 11 at the substantial middle portion of both end portions in the longitudinal direction of the upper wall portion 11, and the protruding portions 13 are depending from the upper wall portion 11 heading toward the heat sink 2.

A circular hole 14, which works as an air intake port, is formed at a central portion of the upper wall portion 11 of the fan case 1, and four pillar portions 15 are radially arranged along the periphery of the circular hole 14 with a constant pitch in the circumference direction thereof. An extending portion 16 is integrally formed with the tip portion of each pillar portion 15. The extending portion 16 extends from the tip portion toward the radially inward direction and supporting a disk portion 17 positioned above the circular hole 4. In addition, an axial flow fan 18 is attached to the disk portion 17 so as to position within the circular hole 14. Ambient air is sucked as cooling air from intake openings defined by neighboring extending portions 16 by fan blades of the axial flow fan and blowed toward the heat sink 2 so as to cool the heat sink 2. Because the axial flow fan 18 is detachably attached to the disk portion 17, the heat sink fan of the present invention can be used semi-permanently by replacing the worn axial flow fan 18 with a new one.

A material of the fan case 1 is preferably engineering plastic or the like that has heat-resistant property, small coefficient of thermal expansion and good stability of dimensions. Particularly, saturated polyester is preferable from a viewpoint of easiness in working and forming. More specifically, a polybutyleneterephthalate (PBT) or a polyethylene terephthalate (PET) reinforced with glass fibers is preferable. The content of the glass fibers can be determined appropriately in accordance with necessary mechanical strength and dimension stability, and it is preferably within the range of 10–40 weight percent, more preferably within the range of 25–35 weight percent. The method of making the fan case using the material is not limited but can be conventional molding methods such as injection molding.

In contrast, the heat sink 2 includes a base member 21, which is made of a copper or a copper alloy having high thermal conductivity, being made by die-cast molding and a lot of heat radiating fins 22. A plurality of linear grooves 211 are formed at a predetermined pitch on the upper surface of the base member 21 for fixing the heat radiating fins 22. In addition, engaging holes 213 are formed on the both sides of the base member 21 to correspond with the protrusions 12b for attaching the fan case 1. These grooves 211 and engaging holes 213 can be formed by machining after molding the base member 21, for example. Alternatively, they can be molded integrally with the base member 21 by using a die.

Figure 2:
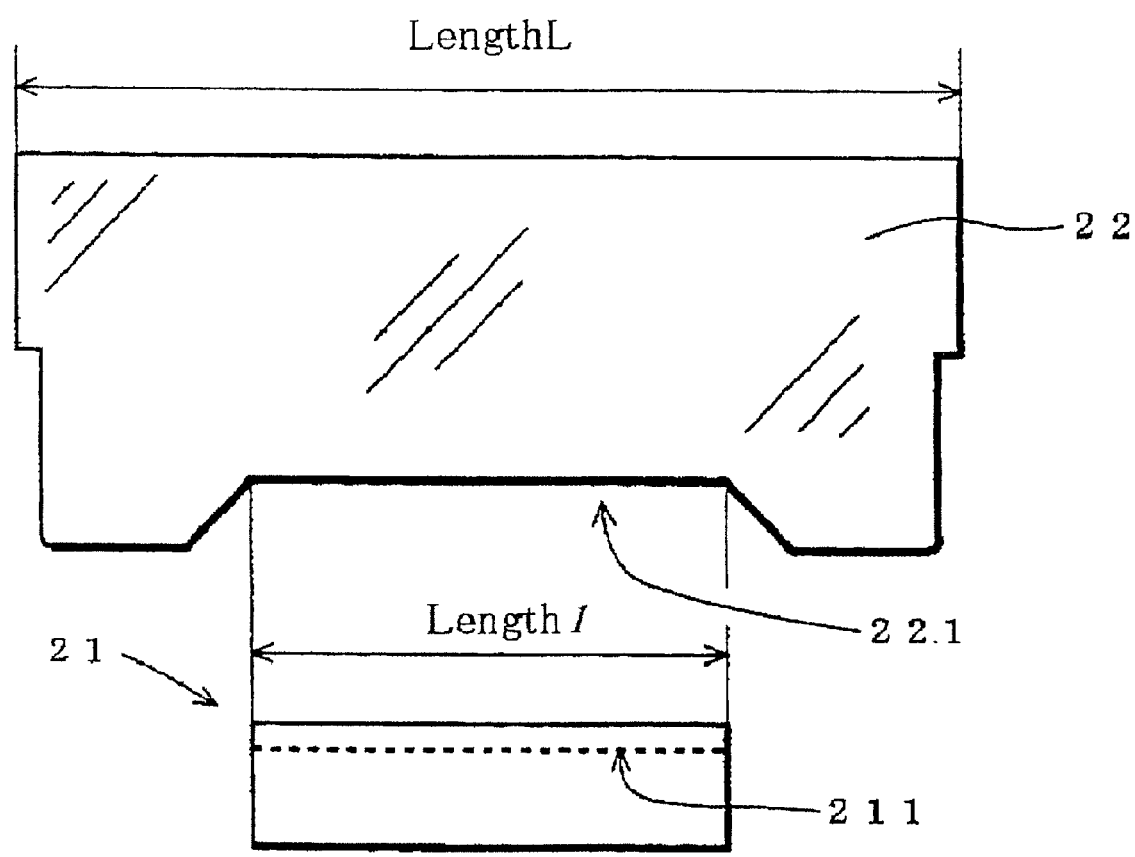
FIG. 2 shows the relationship between a thin heat radiating fin and a base member of the heat sink fan shown in FIG. 1.

The thin heat radiating fin 22 is a rectangular thin plate made of an alumina or the like as shown in FIG. 2. The length L of the heat radiating fin 22 is larger than the length l of the base member 21. A notch portion 221 having a substantially trapezoid shape is formed in the edge of the heat radiating fin 22 at the base member 21 side in a plan view. The upper edge in the height direction of this notch portion 221 of the heat radiating fin 22 has substantially the same length as the length l of the base member 21. When the upper edge of the notch portion 221 is fit in one of grooves 211 that are formed on the base member 21, the heat radiating fin 22 can be positioned easily and fixed to the base member 21 by crimping. In addition, the notch portion 221 prevents the crimped heat radiating fins 22 from moving from the base member 21 in the direction shown by the length l. Though the heat radiating fins 22 can be fixed to the base member 21 without use an adhesive, but it is possible to use an adhesive for fixing more firmly. Furthermore, the length L of the heat radiating fins 22 is longer than the length l of the base member 21, therefore, when the upper edge of the notch portion 221 is fixed to the base member 21 by crimping after fitting in the groove 211, lower edge portions of the heat radiating fins 22 are positioned at both sides of the base member 21 in the direction show by the length l. As a result, heat radiating surface and/or dimension of the heat radiating fin 22 can be increased so that cooling efficiency can be improved. In addition, noise generated by wind induced by the axial flow fan 18 can be reduced.

Furthermore, the base member 21 of the heat sink 2, which is made of a copper or a copper alloy having high thermal conductivity, is positioned at nearly just above a heat-generating electronic component (not shown), and the heat radiating fin 22 is positioned at other part (i.e., at both sides of the base member 21 in the direction indicated by the length l). Therefore, in addition to the above-mentioned operational advantages of the invention, the base member 21 can be downsized, and total weight of the heat sink 2 can be reduced.

Figure 3:
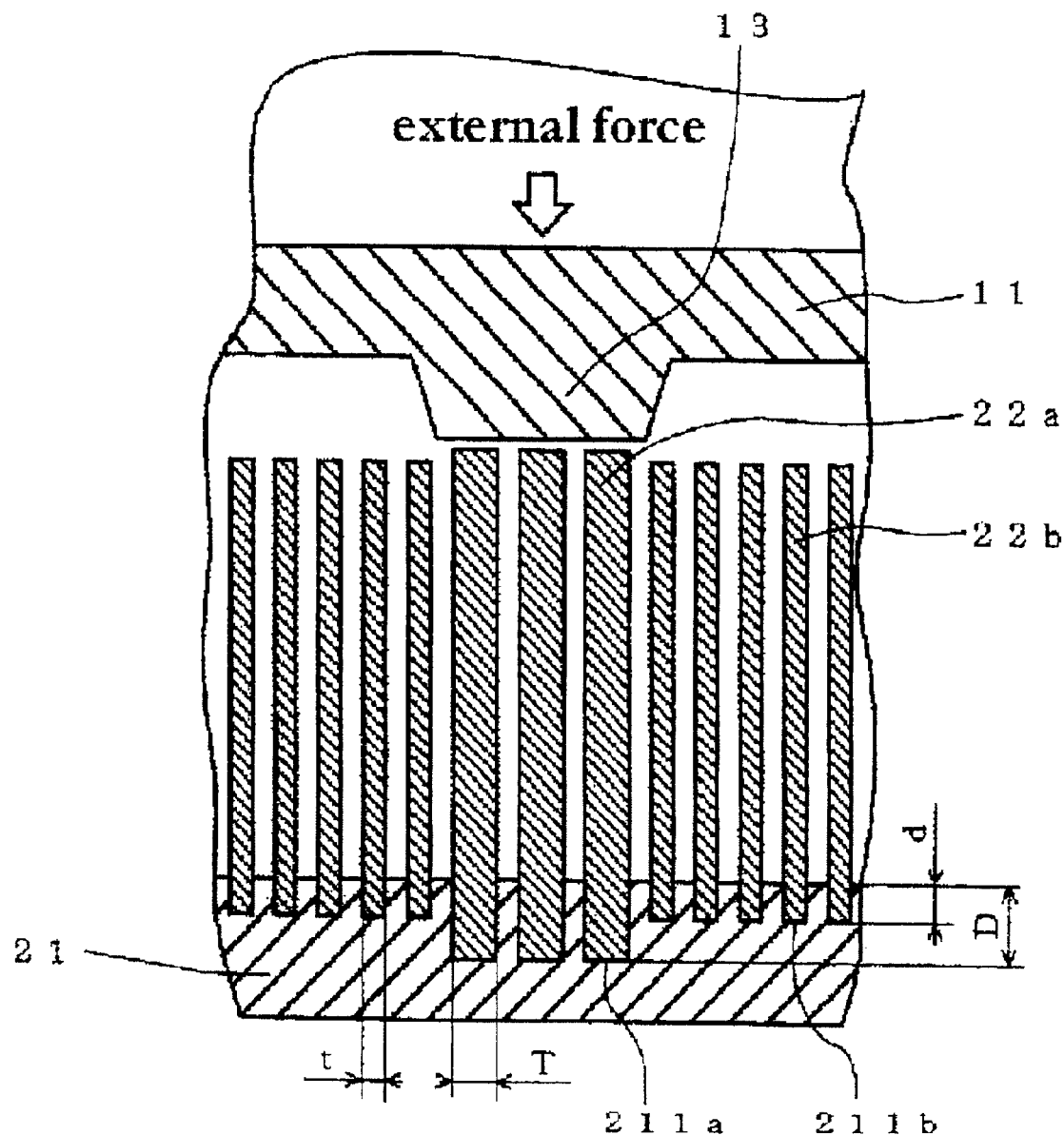
FIG. 3 is an enlarged cross section showing a protruding portion and a part of the thin heat radiating fins of the heat sink fan shown in FIG. 1.

Furthermore, as shown in FIG. 3, the thickness T of the heat radiating fins 22a that face to the protruding portions 13 formed on the fan case 1 is larger than the thickness t of other heat radiating fins 22b (i.e., T>t). Accordingly, even if the fan case 1 is deformed by an external force applied to the heat sink fan and the protruding portions 13 press the heat radiating fin 22a, a deformation of the heat radiating fin 22a to which the protruding portions 13 has pressed can be suppressed, because the thickness T of the heat radiating fin 22a is larger than the thickness t of other heat radiating fins 22b. The thickness T of the heat radiating fins 22a can be determined appropriately in accordance with intensity of a potential external force, a material of the heat radiating fin and other factors, and preferably it is approximately 2–4 times the thickness t of the other heat radiating fins 22b. For example, if the thickness t of the heat radiating fins 22b is 0.4 millimeters (mm), the thickness T of the heat radiating fins 22a is preferably within the range of approximately 0.7-1.5 mm, more preferably within the range of 0.9-1.1 mm. Or, the thickness T of the heat radiating fins 22a is preferably between 1.5 times and 4.0 times the thickness t of the heat radiating fins 22b. In FIG. 3, three heat radiating fins 22a facing to the protruding portion 13 have the thickness T larger than the thickness t of the other heat radiating fins 22b. However, it is sufficient that at least one of the heat radiating fins 22a has the thickness T larger than the thickness t of the other heat radiating fins 22b.

Furthermore, as shown in FIG. 3, it is desirable that the heat radiating fins 22a that have the thickness T larger than the thickness t of the other heat radiating fins 22b fit in the base member 21 more deeply than other heat radiating fins 22b so that the heat radiating fin 22a is fixed to the base member 21 firmly. For this reason, the grooves 211a formed on the base member 21 for the heat radiating fins 22a have large width and great depth corresponding to the heat radiating fin 22a. The depth D of the grooves 211a for the heat radiating fins 22a can be determined appropriately in accordance with height, thickness and material of the heat radiating fin 22a and other factors, and preferably it is approximately 1.5–3.0 times the depth d of other grooves 211b for other heat radiating fins 22b. In addition, the heat radiating fins 22a have the height larger than the height of other heat radiating fins 22b so that other heat radiating fin 22b cannot be deformed by abutting the protruding portions 13.

Figure 4:
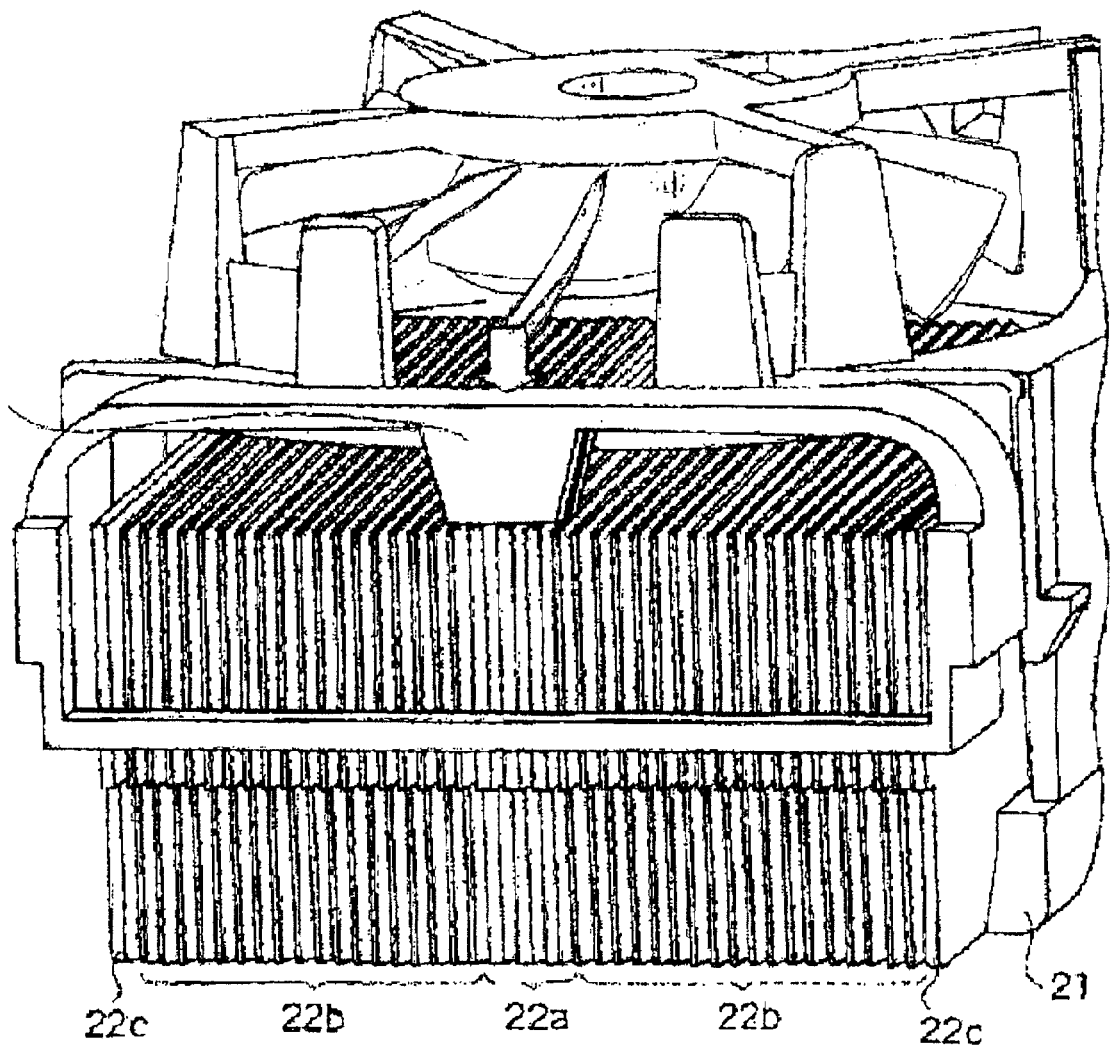
FIG. 4 is a perspective view of a heat sink fan according to a second embodiment of the present invention.

FIG. 4 is a perspective view of a heat sink fan according to a second embodiment of the present invention. According to the heat sink fan illustrated in FIG. 4, not only the thickness of the heat radiating fins 22a facing to the protruding portions 13 but also the thickness of heat radiating fins 22c positioned at the outermost side portions of the heat radiating fins 22a and 22b are increased. In this way, even if an external force is applied to the heat radiating fin, the heat radiating fin 22c can prevent the heat radiating fins 22b positioned inside the heat radiating fin 22c and have a thickness smaller than the heat radiating fin 22a from being deformed. The thickness of the heat radiating fins 22c is not limited to a specific value, but can be a value approximately the same as the heat radiating fins 22a that face to the protruding portions 13. In this case, the heat radiating fins includes two types having different thickness, and it is preferable for productivity that the different types of the heat radiating fins are limited to two types. The depth of engagement of the heat radiating fin 22c with the base member 21 is also preferable to be approximately the same as the heat radiating fin 22a.

In a manufacturing process, there is possibility that an external force is applied to the heat radiating fin 22 of the heat sink 2 and deforms the heat radiating fin 22 when the heat sink 2 is transported by a transferring machine or a worker after the heat radiating fins 22 are fixed to the base member 21 by crimping. Because the thickness of the heat radiating fins 22c positioned at outermost side portions and can be touched by a transferring machine or a worker is increased at least larger than the thickness of the heat radiating fins 22b so as to have more strength among the plural heat radiating fins 22 that fixed to the base member 21, the heat radiating fins 22c are hardly to deform by an external force. Therefore, according to the heat sink fan of the second embodiment of the present invention, the heat sink 2 can be handled easily so that working efficiency in a manufacturing process can be improved.

Next, a method for attaching the fan case 1 to the heat sink 2 will be explained.

Figure 5:
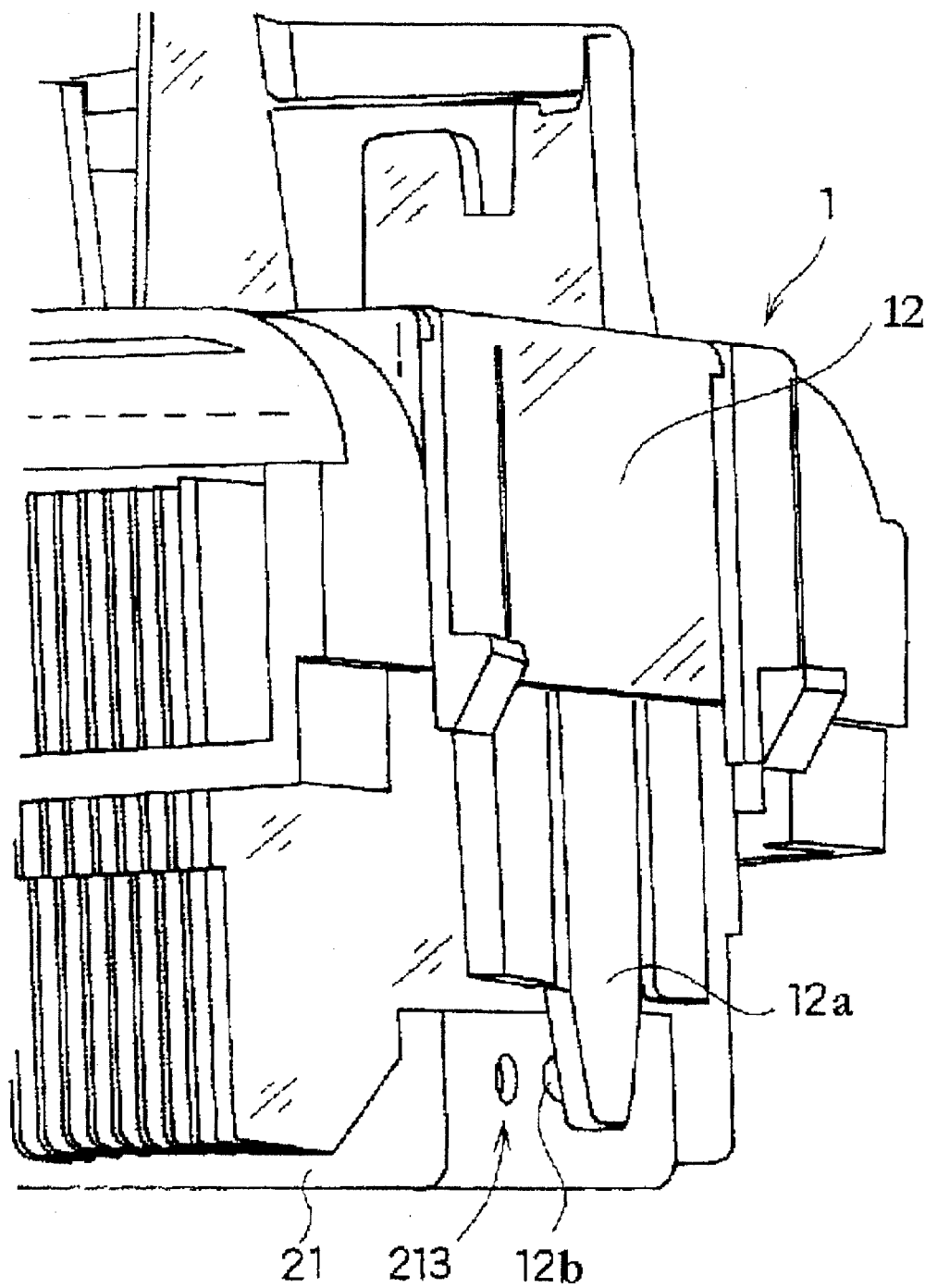
FIG. 5 shows an engaging state when a fan case is attached to a heat sink.

In order to attach the fan case 1 to the heat sink 2 as shown in FIG. 1, the engaging portions 12a of the fan case 1 is positioned on the side edge portions of the base member 21 of the heat sink 2. Then, the fan case 1 is moved downward to the heat sink 2 in this state. First, the protrusions 12b that is formed at the end of the engaging portions 12a is in contact with the side edge portions of the base member 21 and is expanded little outward by an elastic deformation. Then, as shown in FIG. 5, the protrusions 12b reach the engaging holes 213 of the base member 21, when the protrusions 12b engage the engaging holes 213 by elastic restoring force of the engaging portions 12a. This structure enables the fan case 1 to be detachably attached to the heat sink 2. In order to detach the fan case 1 from the heat sink 2, the engaging portions 12a is little pressed in outward so that the protrusions 12b detaches from the engaging holes 213, and then the fan case 1 is moved upward from the heat sink 2. In the example shown in FIG. 5, the engaging portions 12a of the fan case 1 is provided with the protrusions 12b, while the base member 21 is provided with the engaging holes 213. However, it is possible to provide the engaging holes to the fan case 1 and to provide the protrusions to the heat sink 2 so that they engage with each other. In addition, the engaging portions can be formed as other conventional structure such as a recess and a pawl portion. Though the heat sink fan shown in FIG. 5 has a pair of engaging portions 12a provided at the side walls 12 of the fan case 1, the number of engaging portions 12a is not limited but can be two pairs or more.

When the axial flow fan 18 rotates in a predetermined direction in this heat sink fan, ambient air is sucked through intake openings and the circular hole 14 and flows along the heat radiating fin 22. On the other hand, heat generated by the electric component transfers to the plural heat radiating fins 22 by conduction through the base member 21 of the heat sink 2. Then, the heat transfers from the heat radiating fins 22 into the air flow induced by the axial flow fan 18 and then the air is exhausted to the outside of the heat sink 2 through both end portions in longitudinal direction of the heat radiating fins 22. Thus, the heat generated by the electronic component transfers from the heat sink 2 to the flowing air and is dissipated into the outer air of the heat sink 2 by the flowing air.

Though the embodiments of the heat sink fan according to the present invention are explained above, the present invention is not limited to these embodiments but can be modified or corrected within the scope of the present invention.

What is claimed is:

1. A heat sink fan comprising:
 a heat sink including a base member having a planar shape and a plurality of thin heat radiating fins being fixed to the base member so as to be parallel with each other;
 a fan case attached to the heat sink to cover a upper portion of the heat radiating fins, the fan case including an upper wall portion provided with a protruding portion protruding toward the heat radiating fins from the upper wall portion;
 an axial flow fan supported by the fan case and inducing air flow for cooling the heat sink; and
 wherein a thickness of one or more heat radiating fins facing to the protruding portion is larger than a thickness of other heat radiating fins.

2. The heat sink fan according to claim 1, wherein the base member is provided with a plurality of grooves for engaging the heat radiating fins, and a depth of the grooves for engaging the heat radiating fin facing the protruding portion is greater than a depth of the grooves for engaging other heat radiating fins.

3. The heat sink fan according to claim 2, wherein length of the heat radiating fins is longer than length of the base member, a notch portion having a substantially trapezoid shape is provided to the heat radiating fins at the base member side, and the heat radiating fins are fixed to the base member by crimping.

4. The heat sink fan according to claim 1, wherein a thickness of heat radiating fins positioned at outermost side portion is larger than a thickness of other heat radiating fins except the radiating fins facing to the protruding portion.

5. A heat sink fan comprising:
 a heat sink including a base member having a planar shape and a plurality of thin heat radiating fins fixed to the base member so as to be parallel with each other;

a fan case attached to the heat sink to cover upper portion of the heat radiating fins, the fan case including an upper wall portion provided with a protruding portion protruding toward the heat radiating fins from the upper wall portion;

an axial flow fan supported by the fan case and inducing air flow for cooling the heat sink; and wherein a thickness of one or more heat radiating fins facing to the protruding portion is 1.5–4.0 times a thickness of other heat radiating fins.

6. A heat sink fan comprising:

a heat sink including a base member with a plurality of groves and a plurality of thin heat radiating fins engaged with the groves and being fixed to the base member;

a fan case attached to the heat sink to cover upper portion of the heat radiating fins, the fan case including an upper wall portion provided with a protruding portion protruding toward the heat radiating fins from the upper wall portion;

an axial flow fan supported by the fan case and inducing air flow for cooling the heat sink; and wherein a thickness of one or more heat radiating fins facing to the protruding portion is 1.5–4.0 times a thickness of other heat radiating fins and a depth of engagement of the heat radiating fin facing the protruding portion with the base member is 1.5–3.0 times a depth of engagement of other heat radiating fins.

* * * * *